United States Patent
Huang et al.

(10) Patent No.: US 10,689,249 B2
(45) Date of Patent: Jun. 23, 2020

(54) SEMICONDUCTOR DEVICE PACKAGE INCLUDING A WALL AND A GROUNDING RING EXPOSED FROM THE WALL

(71) Applicant: Advanced Semiconductor Engineering, Inc., Kaohsiung (TW)

(72) Inventors: Ching-Han Huang, Kaohsiung (TW); Hsun-Wei Chan, Kaohsiung (TW); Lu-Ming Lai, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/855,684

(22) Filed: Sep. 16, 2015

(65) Prior Publication Data
US 2017/0073221 A1    Mar. 16, 2017

(51) Int. Cl.
*B81B 7/00*    (2006.01)

(52) U.S. Cl.
CPC .......... *B81B 7/0064* (2013.01); *B81B 7/0051* (2013.01); *B81B 2207/096* (2013.01); *B81C 2203/019* (2013.01); *B81C 2203/0118* (2013.01); *B81C 2203/0163* (2013.01)

(58) Field of Classification Search
CPC .............. B81B 7/0064; B81B 7/0051; B81B 2207/096; B81C 1/00333; B81C 2203/019; B81C 2203/0118; B81C 2203/0163; H01L 23/055; H01L 33/48–486; H01L 31/0203
See application file for complete search history.

(56) References Cited

U.S. PATENT DOCUMENTS

| 5,428,188 | A | * | 6/1995 | Dozier | H01L 23/04 174/527 |
| 6,635,953 | B2 | * | 10/2003 | Wu | H01L 23/053 257/659 |
| 7,247,509 | B2 | * | 7/2007 | Yamauchi | H01L 24/97 257/E33.058 |
| 7,732,914 | B1 | | 6/2010 | McLellan et al. | |
| 8,030,722 | B1 | * | 10/2011 | Bolognia | B81B 7/0061 257/433 |
| 8,324,728 | B2 | | 12/2012 | Tabrizi | |
| 8,564,968 | B1 | * | 10/2013 | Heo | H01L 21/50 361/760 |
| 9,070,793 | B2 | * | 6/2015 | Liao | H01L 23/3121 |

(Continued)

FOREIGN PATENT DOCUMENTS

| CN | 2457740 Y | 10/2001 |
| CN | 101093817 A | 12/2007 |

(Continued)

OTHER PUBLICATIONS

Office Action for corresponding Chinese Patent Application No. 201610712167.X, dated Aug. 5, 2019, 10 pages.

(Continued)

*Primary Examiner* — Stephen M Bradley
(74) *Attorney, Agent, or Firm* — Foley & Lardner LLP (57) ABSTRACT

A semiconductor device package includes a carrier, a wall disposed on a top surface of the carrier, a cover, and a sensor element. The cover includes a portion protruding from a bottom surface of the cover, where the protruding portion of the cover contacts a top surface of the wall to define a space. The sensor element is positioned in the space.

16 Claims, 10 Drawing Sheets

(56) References Cited

U.S. PATENT DOCUMENTS

| | | | |
|---|---|---|---|
| 9,162,869 B1* | 10/2015 | Chen .................... | B81B 7/0064 |
| 9,511,991 B2 | 12/2016 | Baillin et al. | |
| 2006/0060953 A1* | 3/2006 | Yang .................... | H01L 23/045 |
| | | | 257/678 |
| 2008/0063232 A1 | 3/2008 | Song | |
| 2010/0244161 A1* | 9/2010 | Tabrizi ................. | H01L 23/055 |
| | | | 257/415 |
| 2011/0115059 A1* | 5/2011 | Lee ....................... | H01L 21/561 |
| | | | 257/659 |
| 2014/0017843 A1* | 1/2014 | Jung .................... | B81C 1/00269 |
| | | | 438/51 |
| 2014/0117473 A1* | 5/2014 | Kierse .................... | H04R 1/02 |
| | | | 257/416 |
| 2015/0091108 A1* | 4/2015 | Huang ................. | B81B 7/0058 |
| | | | 257/417 |

FOREIGN PATENT DOCUMENTS

| | | |
|---|---|---|
| CN | 101141834 A | 3/2008 |
| CN | 101878527 A | 11/2010 |
| CN | 102196989 A | 9/2011 |
| CN | 104340948 A | 2/2015 |

OTHER PUBLICATIONS

Search Report for corresponding Chinese Patent Application No. 201610712167.X, dated Aug. 5, 2019, 6 pages.

\* cited by examiner

SEMICONDUCTOR DEVICE PACKAGE INCLUDING A WALL AND A GROUNDING RING EXPOSED FROM THE WALL

BACKGROUND

1. Technical Field

The present disclosure relates to a semiconductor device package and a method of making the same, and more particularly, to a semiconductor device package having a micro-electro-mechanical systems (MEMS) device and a manufacturing method thereof.

2. Description of the Related Art

Packaging requirements for MEMS devices (such as MEMS dies) can be much more complex than traditional IC packaging requirements. For example, an acoustic sensor package should include an aperture to allow transmission of sound waves, while blocking dust, electromagnetic interference (EMI), and other environmental influences.

One approach for packaging a MEMS device is to place a metal lid over the MEMS device to protect the MEMS device from environmental influences such as EMI and contamination (e.g., dust and water). However, this approach can result, for example, in a relatively large distance between a sidewall of the metal lid and a sidewall of a substrate on which, or in which, the MEMS device is disposed, to avoid a situation during singulation of a sawing blade directly sawing the metal lid, which causes rapid consumption of the sawing blade. Accordingly, a metal lid can contribute to the size of the package, and therefore packages with metal lids may not be suitable for consumer applications where reduction in size is highly desirable. Moreover, covering the MEMS device with a metal lid, such as by a pick-and-place technique, adds time and material cost to the manufacturing process.

SUMMARY

In an embodiment, a semiconductor device package includes a carrier, a wall disposed on a top surface of the carrier, a cover, and a sensor element. The cover includes a portion protruding from a bottom surface of the cover, where the protruding portion of the cover contacts a top surface of the wall to define a space. The sensor element is positioned in the space.

In an embodiment, a semiconductor device package includes a carrier with at least one pad, an active component on the carrier, a cover, and a conductive layer. The cover includes an extension portion, a top portion coupled to the extension portion, and a reinforced element coupled to the extension portion and the top portion. The conductive layer is disposed on a lower surface of the cover. The cover and the carrier form an accommodating space around the active component, and the conductive layer is electrically connected to at least one of the pads.

In an embodiment, a method of manufacturing a semiconductor device package includes (a) providing a carrier; (b) placing a wall on a top surface of the carrier; (c) placing a sensor element on the carrier; and (d) placing a cover on the wall. The cover includes an extension portion protruding from a bottom surface of the cover, where the extension portion of the cover contacts a top surface of the wall.

Common reference numerals are used throughout the drawings and the detailed description to indicate the same or similar components. The present disclosure will be more apparent from the following detailed description taken in conjunction with the accompanying drawings.

DETAILED DESCRIPTION

Because housings, metal lids and casings increase the size of a semiconductor package, the use of such housings or casings is counter-indicated for implementation within small semiconductor devices. The present disclosure describes techniques suitable for the manufacture of smaller MEMS device packages, which can also reduce manufacturing costs.

Figure 1A:
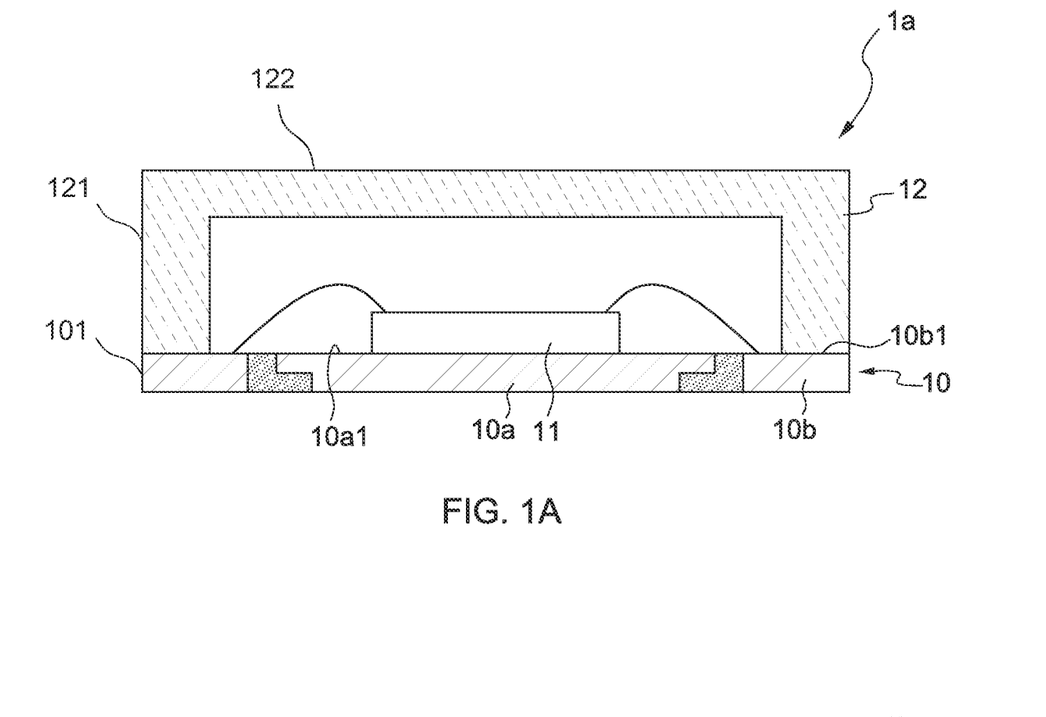
FIG. 1A illustrates a cross-sectional view of a semiconductor device package in accordance with an embodiment of the present disclosure.

FIG. 1A illustrates a cross-sectional view of a semiconductor device package 1a in accordance with an embodiment of the present disclosure. The semiconductor device package 1a includes a carrier 10, a sensor element 11 and a cover 12.

In one or more embodiments, the carrier 10 is a premolded leadframe including a die pad 10a and leads 10b. In one or more embodiments, the leadframe is, or includes, copper or a copper alloy. In other embodiments, the leadframe includes one of, or a combination of, iron, an iron alloy, nickel, a nickel alloy, or another metal or metal alloy. In one or more embodiments, the leadframe is coated with a silver or a copper layer.

In one or more embodiments, the carrier 10 is a substrate. The substrate is, for example, a printed circuit board (PCB), such as a paper-based copper foil laminate, a composite copper foil laminate, or a polymer-impregnated glass-fiberbased copper foil laminate. The substrate can include a core layer which is made of a bismaleimide-triazine (BT) resin or a glass-reinforced epoxy composite (e.g., an FR-4 composite).

In one or more embodiments, the carrier 10 is a semiconductor die. The semiconductor die may be, for example, an application-specific integrated circuit (ASIC) die.

The sensor element 11 is, or includes, an active component. The sensor element 11 is disposed on a top surface 10a1 of the die pad 10a of the carrier 10. As shown for the embodiment of FIG. 1A, the sensor element 11 is connected to the leads 10b by wire bonding. In another embodiment, the sensor element 11 may be electrically connected to the die pad 10a by flip chip bonding.

The cover 12 is positioned on a top surface 10b1 of ones of the metal leads 10b of the carrier 10. The cover 12 and the carrier 10 together define a space to accommodate the sensor element 11 and to protect the sensor element 11. In one or more embodiments, the cover 12 is a plastic cover (e.g., a liquid crystal polymer). In comparison with a metal lid, the plastic cover 12 can be sawn with less consumption of the sawing blade, and thus it is not needed to provide extra space to allow the sawing blade to avoid the plastic cover 12 during singulation (as would be the case for a metal lid, resulting in a larger package size). Thus, a sidewall 121 of the cover 12 and a sidewall 101 of the carrier 10 are coplanar after singulation in the embodiment of FIG. 1A. In one or more embodiments, the sidewall 121 of the cover 12 is substantially perpendicular to an upper surface 122 of the cover 12 after singulation.

Figure 1B:
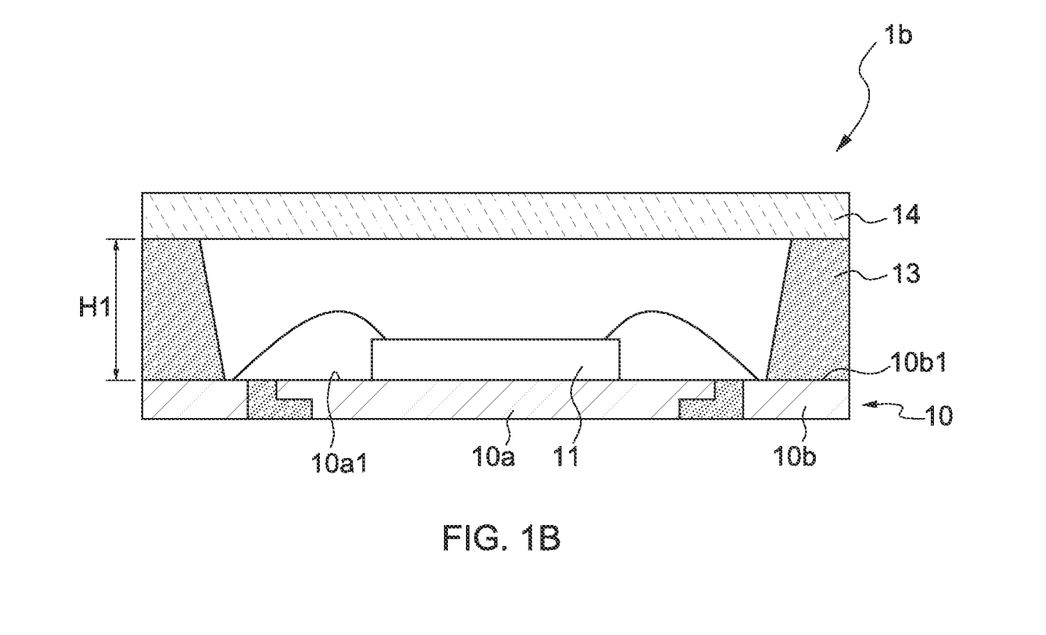
FIG. 1B illustrates a cross-sectional view of a semiconductor device package in accordance with an embodiment of the present disclosure.

FIG. 1B illustrates a cross-sectional view of a semiconductor device package 1b in accordance with an embodiment of the present disclosure. The semiconductor device package 1b is similar to the semiconductor device package 1a shown in FIG. 1A, except that the cover 12 in FIG. 1A is replaced by a wall 13 and a cover 14 in FIG. 1B.

The wall 13 is disposed on the top surface 10b1 of ones of the leads 10b of the carrier 10. The wall 13 may include, for example, a thermoset polymer or an epoxy resin having fillers dispersed therein. The cover 14 may include a similar material as discussed for the cover 12 of FIG. 1A.

The cover 14 is disposed on the wall 13. An upper surface of the wall 13 is substantially flat, so that the cover 14 is readily disposed on the wall 13. The cover 14, the wall 13 and the carrier 10 together define a space to accommodate the sensor element 11 and to protect the sensor element 11.

The wall 13 has a height H1. To accommodate a loop height of the wires which connect the sensor element 11 to the leads 10, the wall 13 may be relatively high, such that the wall 13 may be vulnerable to environmental stress. For example, a stress on the wall which in turn causes a stress at an intersection of the wall 13 with the cover 14 may cause an upper edge or corner of the wall 13 to become brittle. Such brittleness could lead to failure of the semiconductor device package 1b.

Figure 1C:
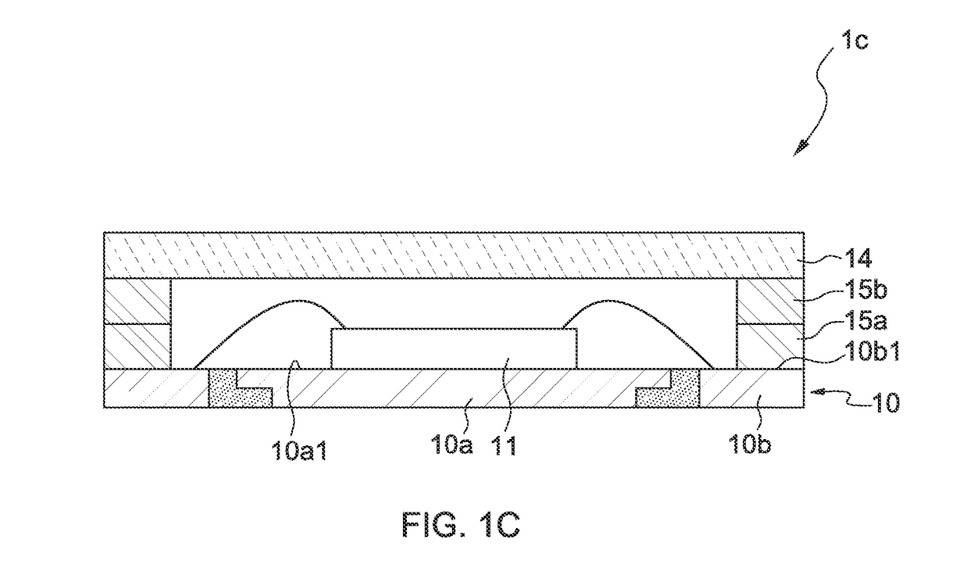
FIG. 1C illustrates a cross-sectional view of a semiconductor device package in accordance with an embodiment of the present disclosure.

FIG. 1C illustrates a cross-sectional view of a semiconductor device package 1c in accordance with an embodiment of the present disclosure. The semiconductor device package 1c is similar to the semiconductor device package 1b shown in FIG. 1B, except that the wall 13 in FIG. 1B is replaced by two stacked wall elements, herein two stacked PCBs 15a, 15b. In other embodiments, additional stacked PCBs are included with the two stacked PCBs 15a, 15b.

The stacked PCBs 15a, 15b, the cover 14 and the carrier 10 together define a space to accommodate the sensor element 11 and to protect the sensor element 11. The stacked PCBs 15a, 15b may have a relatively more robust structure as compared to the wall 13 of the embodiment illustrated in FIG. 1B. For example, stress on one of the PCBs 15a, 15b may not cause stress at an intersection of the PCB 15b with the cover 14 sufficient to cause brittleness at an upper edge or corner of the PCB 15b. Although the stacked PCBs 15a, 15b may improve reliability, manufacturing cost and complexity may increase by their use.

Figure 2:
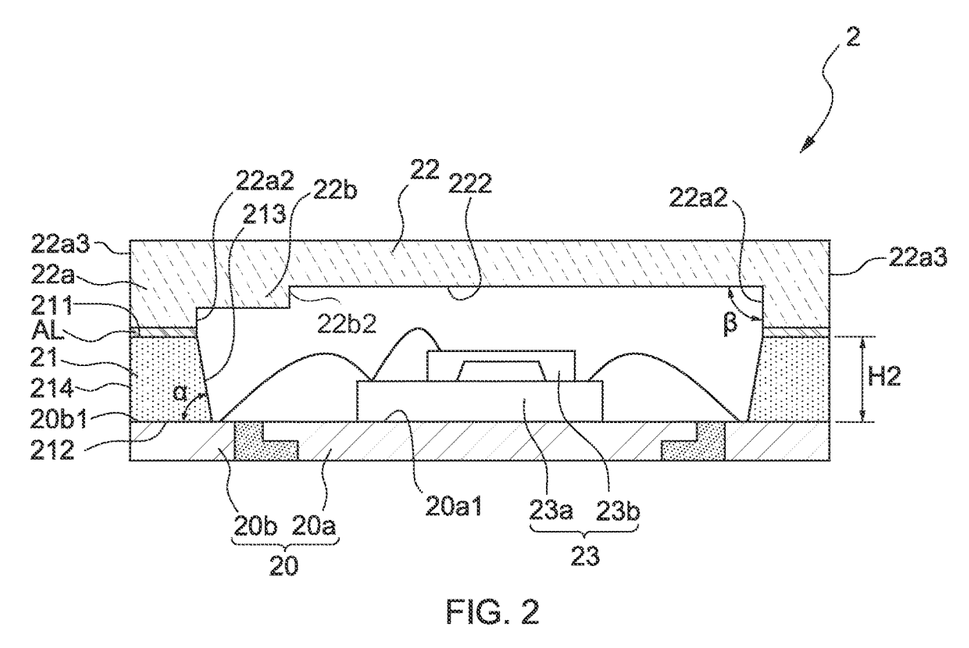
FIG. 2 and FIG. 2A illustrate a cross-sectional view of a semiconductor device package in accordance with an embodiment of the present disclosure.

FIG. 2 illustrates a cross-sectional view of a semiconductor device package 2 in accordance with an embodiment of the present disclosure. The semiconductor device package 2 includes a carrier 20, a wall 21, a cover 22, and a sensor element 23.

In one or more embodiments, the carrier 20 is a leadframe including a die pad 20a and leads 20b. In one or more embodiments, the leadframe is, or includes, copper or a copper alloy. In other embodiments, the leadframe may include one of, or a combination of, iron, an iron alloy, nickel, a nickel alloy, or another metal or metal alloy. In one or more embodiments, the leadframe is coated with a copper or a silver layer.

In one or more embodiments, the carrier 20 is a substrate. The substrate is, for example, a PCB, such as a paper-based copper foil laminate, a composite copper foil laminate, or a polymer-impregnated glass-fiber-based copper foil laminate. The substrate can include a core layer which is made of a BT resin or an FR-4 composite.

In one or more embodiments, the carrier 20 is a semiconductor die. The semiconductor die may be, for example, an ASIC die.

The sensor element 23 is, or includes, an active component. The sensor element 23 is disposed on a top surface 20a1 of the die pad 20a of the carrier 20. As illustrated in the embodiment of FIG. 2, the sensor element 23 is connected to the leads 20b by wire bonding. In another embodiment, the sensor element 23 may be connected to the die pad 20a by flip chip bonding.

In one or more embodiments, the sensor element 23 includes one of, or a combination of, ASICs and MEMS devices. For example, the sensor element 23 of FIG. 2 includes an ASIC 23a and a MEMS device 23b (or a MEMS device 23a and an ASIC 23b). The ASIC 23a may be used, for example, to read out the information obtained by the MEMS device 23b, and to transmit or make calculations on the information in an analog or a digital mode.

The wall 21 is disposed on a top surface 20b1 of ones of the leads 20b of the carrier 20. The wall 21 includes, for example, a thermoset polymer or an epoxy resin having fillers dispersed therein. An angle α is defined by a first lateral surface 213 of the wall 21 and a bottom surface 212 of the wall 21. The angle α is less than 90 degrees. In an embodiment, the angle α is in a range from approximately 78 degrees to approximately 83 degrees.

The cover 22 includes an extension or protruding portion 22a protruding from a bottom surface 222 of the cover 22. The extension portion 22a may be integral with a remaining portion of the cover 22, or may be included as a separate component from the cover 22. The extension portion 22a of the cover 22 can improve a manufacturing yield when manufacturing the cover 22 by injection molding. The extension portion 22a of the cover 22 is attached to the top surface 211 of the wall 21 by an adhesive material, labeled 'AL' in FIG. 2. The adhesive material AL may be electrically conductive or non-conductive. The cover 22, the wall 21 and the carrier 20 together define a space to accommodate the sensor element 23 and to protect the sensor element 23. In one or more embodiments, the cover 22 is, or includes, an aromatic polymer material (e.g., a liquid crystal polymer).

The extension portion 22a of the cover 22 has a first lateral surface 22a2 and a second lateral surface 22a3 opposite to the first lateral surface 22a2. The second lateral surface 22a3 of the extension portion 22a of the cover 22 is substantially coplanar with a second lateral surface 214 of the wall 21. In one or more embodiments, the cover 22 and the wall 21 are both made of a macromolecule material, and have better bonding force therebetween in comparison with the use of the plastic cover 12 and the metal leads 10b as illustrated in FIG. 1A.

Figure 2A:
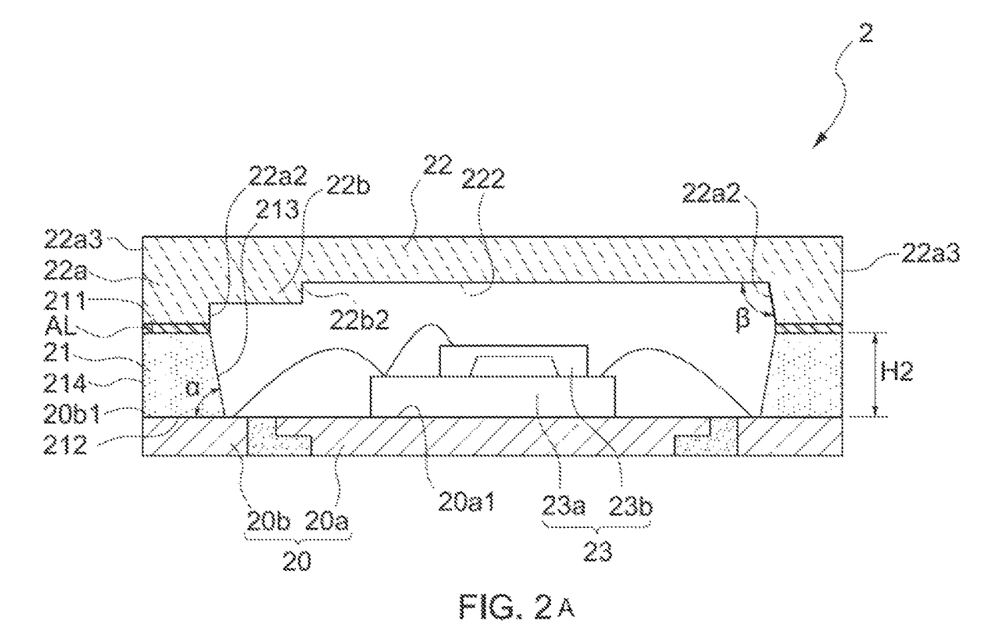

The first lateral surface 22a2 of the extension portion 22a and the bottom surface 222 of the cover 22 define an angle β that is 90 degrees or greater. In an embodiment, the angle β is in a range from approximately 93 degrees to approximately 97 degrees (see FIG. 2A).

In one or more embodiments, the cover 22 includes a reinforced element 22b that is in contact with the bottom surface 222 of the cover 22 and the extension portion 22a of the cover 22. The reinforced element 22b may be integral with a remaining portion of the cover 22, or may be included as a separate component from the cover 22. The reinforced element 22b of the cover 22 can improve a manufacturing yield when manufacturing the cover 22 by injection molding. The reinforced element 22b is used to strengthen the structure of the cover 22. In one or more embodiments, a height of the reinforced element 22b (in the orientation shown in FIG. 2) is less than a height of the extension portion 22a. In other embodiments, the height of the reinforced element 22b is approximately equal to, or somewhat greater than, the height of the extension portion 22a.

In one or more embodiments, the cover 22 defines one or more holes (not shown) to discharge the internal ambient environment (e.g., air or fluid) from the space defined by the wall 21 and the cover 22.

In one or more embodiments, the wall 21 is a polymeric material. In comparison with the use of the plastic cover 12 and the metal leads 10b as illustrated in FIG. 1A, a relatively greater bonding force may be formed between the metal leads 20b and the polymeric wall 21.

A height H2 of the wall 21 may be relatively less than the height H1 of the wall 13 of FIG. 1B, due to the extension portion 22a of the cover 22. Reduction of the height H2 of the wall 21 can improve a durability of the wall 21. For example, the relatively greater top surface area of the wall 21 as compared to the top surface of the wall 13 in FIG. 1B may provide relatively greater endurance against environmental stress.

Figure 3A:
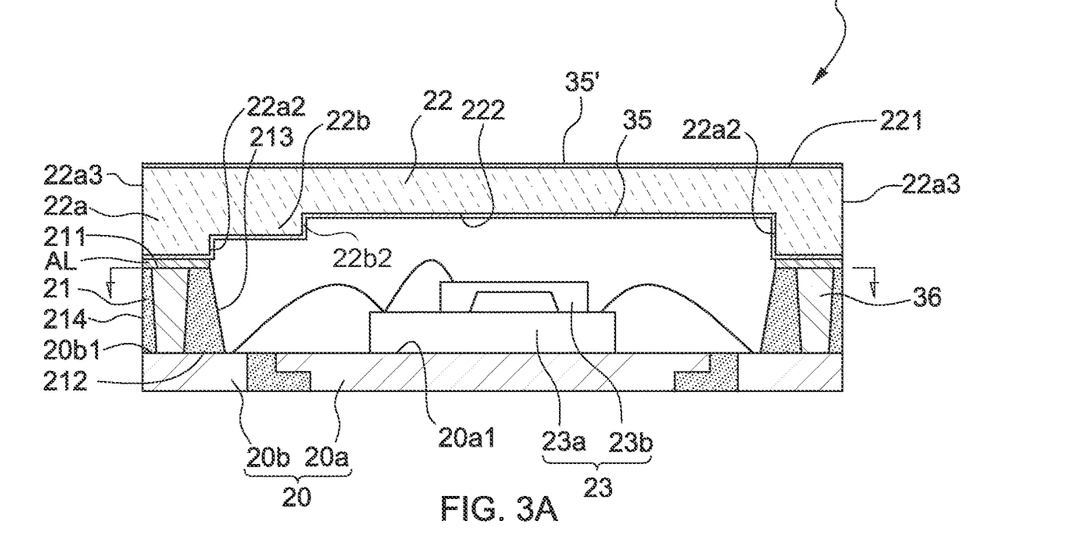
FIG. 3A illustrates a cross-sectional view of a semiconductor device package in accordance with an embodiment of the present disclosure.

FIG. 3A illustrates a cross-sectional view of a semiconductor device package 3 in accordance with an embodiment of the present disclosure. The semiconductor device package 3 is similar to the semiconductor device package 2 shown in FIG. 2, except that the semiconductor device package 3 further includes one or more conductive elements 36 and conductive layers 35, 35'.

The conductive element 36 penetrates the wall 21 and electrically connect the conductive adhesive material AL with the top surface 20b1 of the leads 20b of the carrier 20. The conductive element 36 is formed in a downward-tapering shape (in the orientation of FIG. 3A).

The conductive layer 35' covers an upper surface 221 of the cover 22. The conductive layer 35 covers the bottom surface 222 of the cover 22, the first lateral surface 22a2 of the extension portion 22a, and a lateral surface 22b2 of the reinforced element 22b. The conductive layers 35, 35' are electrically connected to grounding leads (not shown in FIG. 3A) through the conductive adhesive material AL and the conductive element 36, so as to form a grounding path. The cover 22 coated with one or both of the conductive layers 35, 35' can be used as an EMI shield.

Figure 3B:
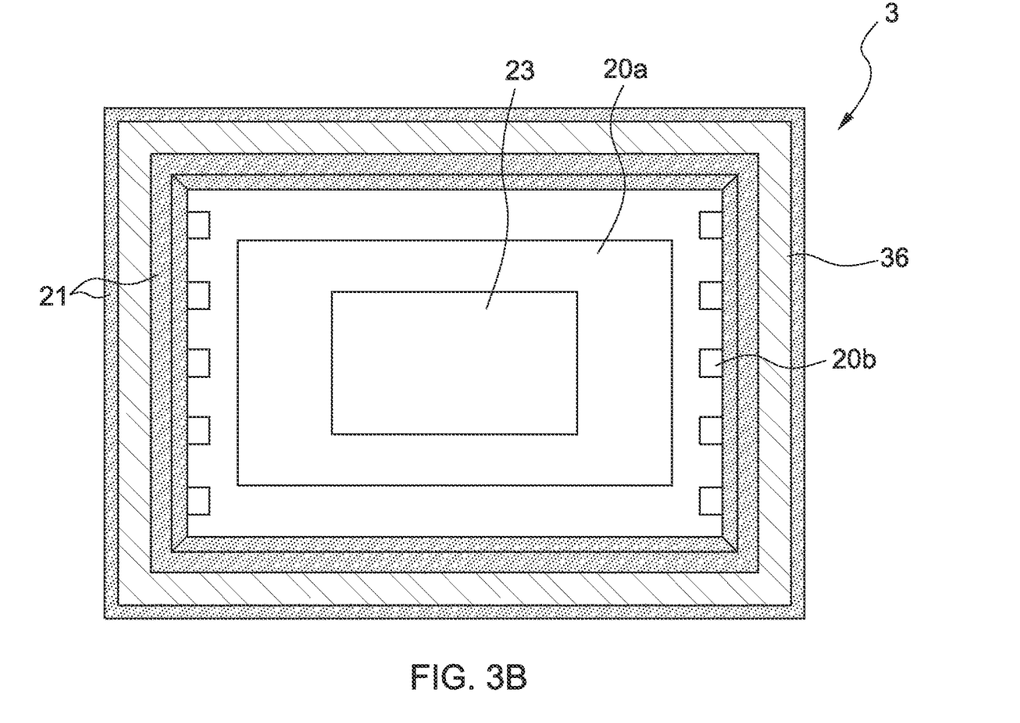
FIG. 3B illustrates a top view of a semiconductor device package in accordance with an embodiment of the present disclosure.

FIG. 3B illustrates a top view of the semiconductor device package 3 of FIG. 3A in accordance with an embodiment of the present disclosure. The semiconductor device package 3 is shown without the cover 22 to facilitate an understanding of the structure underneath the cover 22. As shown in FIG. 3B, the conductive element 36 is arranged around a perimeter of the carrier 20 to form a grounding ring. The conductive element 36 is electrically connected to a package ground through at least one ground lead of the leads 20b.

Figure 4A:
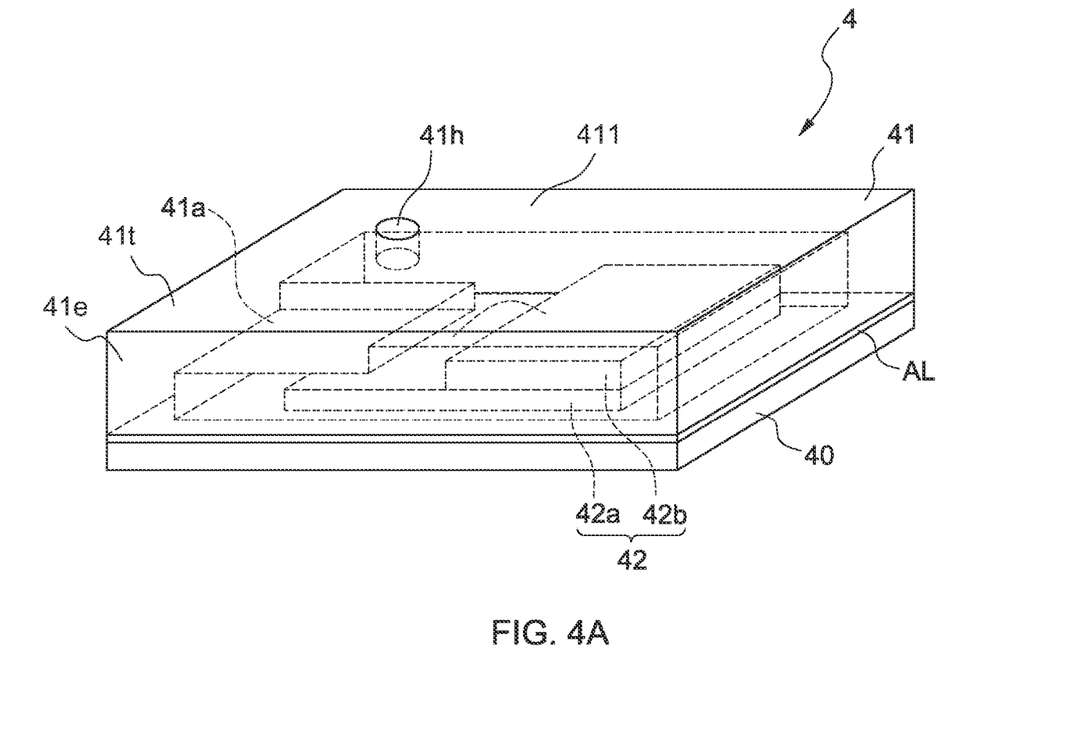
FIG. 4A illustrates a perspective view of a semiconductor device package in accordance with an embodiment of the present disclosure.

FIG. 4A illustrates a perspective view of a semiconductor device package 4 in accordance with an embodiment of the present disclosure. The semiconductor device package 4 includes a carrier 40, a cover 41 and a sensor element 42.

The cover 41 is disposed on the carrier 40 to accommodate and protect the sensor element 42. The cover 41 includes an extension portion 41e that extends around a periphery of the semiconductor device package 4, and a top portion 41t coupled to (attached to, or integrally formed with) the extension portion 41e. The cover 41 further includes a strengthening reinforced element 41a coupled to (attached to, or integrally formed with) the top portion 41t and/or the extension portion 41e, at a predetermined location of the inner surface of the cover 41. The reinforced element 41a is used to strengthen the structure of the cover 41.

The cover 41 defines a hole 41h on a top surface 411 of the cover 41. The hole 41h penetrates the cover 41. The hole 41h is positioned away from the reinforced element 41a. The hole 41h of the cover 41 is used to discharge the internal ambient environment (e.g., air or fluid) from the space defined by the cover 41 and the carrier 40. In addition, the hole 41h of the cover 41 can reduce the residual stress of the cover 41 so as to prevent deformation of the cover 41, such as due to a pressure or thermal differential between the external ambient environment outside the semiconductor device package 4 and the internal ambient environment within the space defined by the cover 41 and the carrier 40.

The sensor element 42 is disposed on the carrier 40. The sensor element 42 is positioned away from (e.g., not located below) the hole 41h of the cover, so as to protect the sensor element 42 from contamination from the external ambient environment (e.g. dust or motes).

Figure 4B:
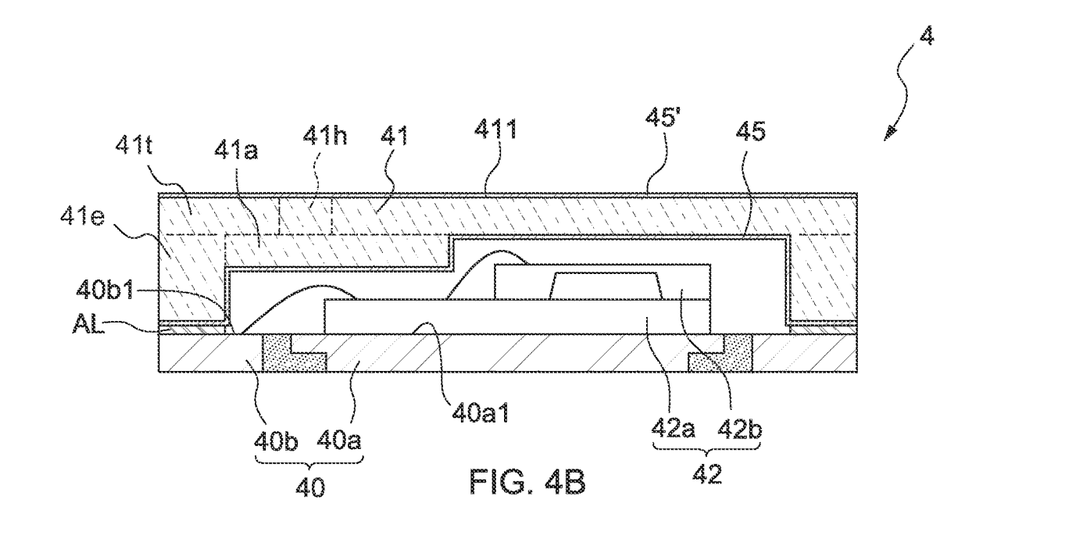
FIG. 4B illustrates a cross-sectional view of a semiconductor device package in accordance with an embodiment of the present disclosure.

FIG. 4B illustrates a cross-sectional view of the semiconductor device package 4 of FIG. 4A in accordance with an embodiment of the present disclosure.

In one or more embodiments, the carrier 40 is a leadframe. In one or more embodiments, the leadframe is, or includes, copper or a copper alloy; however, in one or more embodiments, the leadframe includes one of, or a combination of iron, an iron alloy, nickel, a nickel alloy, or other metal or alloy. In some embodiments, the leadframe is coated with a copper or a silver layer.

In one or more embodiments, the carrier 40 is a substrate. The substrate may include organic or inorganic materials, or a combination thereof. The substrate may be, for example, a PCB, such as a paper-based copper foil laminate, a composite copper foil laminate, or a polymer-impregnated glass-fiber-based copper foil laminate. The carrier 40 can include a core layer which is made of BT resin or FR-4.

In one or more embodiments, the carrier 40 is a semiconductor die (e.g., an ASIC die).

In one or more embodiments, the carrier 40 includes a die pad 40a. In other embodiments, the die pad 40a is omitted. In one or more embodiments, the carrier 40 includes pads 40b, which may be leads of a leadframe, pads in or on a substrate, or electrical connections of a die. The sensor element 42 is disposed on a top surface 40a1 of the carrier 40. In the embodiment illustrated in FIG. 4B, the sensor element 42 is connected to the pads 40b by wire bonding. In other embodiments, the sensor element 42 may be connected to the carrier 40 by flip chip bonding. In one or more embodiments, the sensor element 42 includes an ASIC 42a and a MEMS device 42b (or a MEMS device 42a and an ASIC 42b). The ASIC 42a may be used, for example, to read out information obtained by the MEMS device 42b, and to transmit or make calculations on the information in an analog or a digital mode. In one or more embodiments in which the carrier 40 is a semiconductor die, the semiconductor die replaces the ASIC 42a, the ASIC 42a is omitted, and the MEMS device 42b is disposed on the carrier 40. In one or more embodiments in which the carrier 40 is a substrate, portions of one or both of the ASIC 42a and the MEMS device 42b are disposed within the substrate and below the top surface 40a1 of the substrate (in the orientation shown in FIG. 4B).

The cover 41 is disposed on the top surface 40a1 of the carrier 40 at a peripheral portion 40b1 of the top surface 40a1, using an adhesive material AL. The cover 41 and the carrier 40 together define a space to accommodate and protect the sensor element 42. In one or more embodiments, the cover 41 is, or includes, an aromatic polymer material. In one or more embodiments, the adhesive material AL is an electrically conductive adhesive material.

A conductive layer 45' covers the top surface 411 of the cover 41. A conductive layer 45 covers a lower surface of the cover 41 (e.g., inner surfaces of the cover 41 and the reinforced element 41a, as illustrated in FIG. 4B). The conductive layers 45, 45' are electrically connected to a ground contact such as a ground potential pin, via, pad, or plane (e.g., such as the pad 40b shown in FIG. 4B, or other ground contact) through the conductive adhesive material AL, so as to form a grounding path. The cover 41 coated with one or both of the conductive layers 45, 45' can be used as an EMI shield.

Figure 5A:
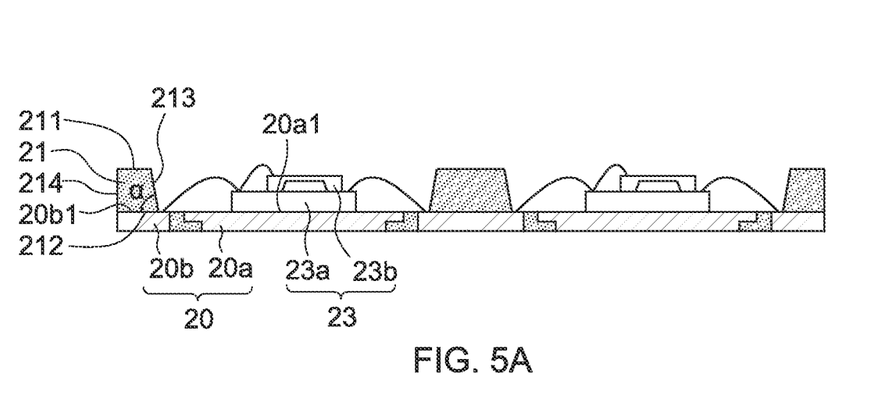
FIG. 5A, FIG. 5B and FIG. 5C illustrate a manufacturing process in accordance with an embodiment of the present disclosure.
Figure 5B:
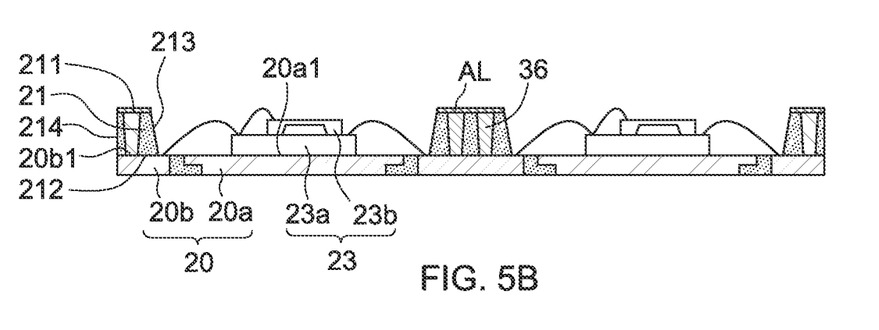
Figure 5C:
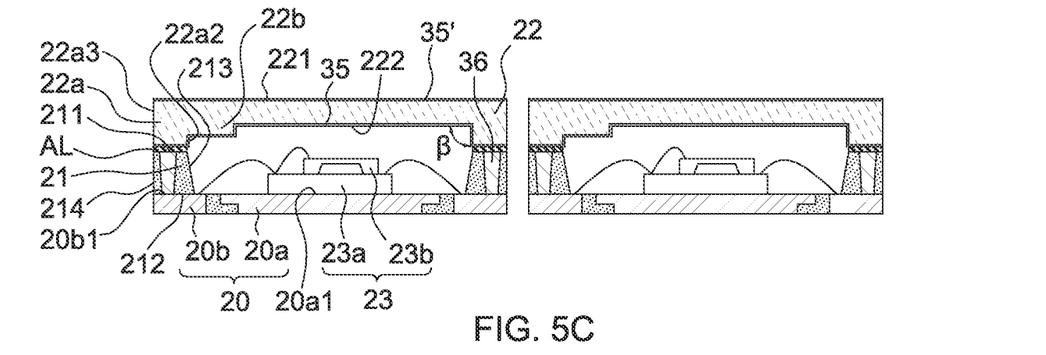

FIG. 5A, FIG. 5B and FIG. 5C illustrate a manufacturing process in accordance with an embodiment of the present disclosure.

Referring to FIG. 5A, a carrier 20 is provided. In one or more embodiments, the carrier 20 is in a strip of carriers 20; in other embodiments, the carrier 20 is in a matrix of carriers 20 (e.g., with N columns and M rows, where M and N can be different or the same). In the embodiment illustrated in FIG. 5A, the carriers 20 are leadframes, and each carrier 20 includes a die pad 20a and leads 20b. In one or more embodiments of the present disclosure, the carriers 20 are substrates. In one or more embodiments, the carriers 20 include a core layer of BT resin or FR-4. In one or more embodiments, the carriers 20 are semiconductor dies (e.g., ASIC dies).

A wall 21 is formed on, or disposed on, a top surface 20b1 of ones of the leads 20b of the carrier 20. The wall 21 is formed by a pre-mold process. An angle α defined by a first lateral surface 213 of the wall 21 and a bottom surface 212 of the wall 21 is less than 90 degrees. In an embodiment, the angle α is in a range from approximately 78 degrees to approximately 83 degrees. In one or more embodiments, the wall 21 includes a thermoset polymer or an epoxy resin having fillers dispersed therein.

A sensor element 23 is disposed on a top surface 20a1 of the die pad 20a of the carrier 20. As illustrated in FIG. 5A, the sensor element 23 is connected to the leads 20b by wire bonding. In other embodiments, the sensor element 23 is connected to the die pad 20a by flip chip bonding.

Referring to FIG. 5B, conductive elements 36 are formed to penetrate the wall 21. Each conductive element 36 is formed by drilling a downward-tapering through hole from a top surface 211 of the wall 21 to penetrate the wall 21 and expose a portion of the top surface 20b1 of the leads 20b of the carrier 20, and then filling the through hole with a conductive material.

An adhesive material AL is formed or disposed on the top surface 211 of the wall 21 to cover the top surface 211 of the wall 21 and the conductive elements 36. In one or more embodiments, the adhesive material AL is an electrically conductive adhesive material.

Referring to FIG. 5C, a cover 22 is placed on the wall 21. In one or more embodiments, the cover 22 is in a strip of covers 22; in other embodiments, the cover 22 is in a matrix of covers 22 (e.g., with R columns and S rows, wherein R and S can be different or the same). Use of a strip or matrix of covers 22 reduces manufacturing time; for example, multiple covers 22 may be applied substantially concurrently (or in quick succession) to respective carriers 20.

The cover 22 includes an extension portion 22a protruding from a bottom surface 222 of the cover 22. The extension portion 22a of the cover 22 is attached to the wall 21 by the adhesive material AL. In one or more embodiments, the cover 22 is, or includes, an aromatic polymer material.

The extension portion 22a of the cover 22 has a first lateral surface 22a2 and a second lateral surface 22a3 opposite to the first lateral surface 22a2. The second lateral surface 22a3 of the extension portion 22a of the cover 22 is substantially coplanar with a second lateral surface 214 of the wall 21.

An angle β defined by the first lateral surface 22a2 of the extension portion 22a and the bottom surface 222 of the cover 22 is 90 degrees or greater. In an embodiment, the angle β is in a range from approximately 93 degrees to approximately 97 degrees.

Before placing the cover 22 on the wall 21, a reinforced element 22b can be formed on the bottom surface 222 of the cover, in contact with the extension portion 22a of the cover 22. The reinforced element 22b is used to strengthen the structure of the cover 22, so as to reduce or avoid twisting or bending of the cover 22.

Before placing the cover 22 on the wall 21, a conductive layer 35 is formed to cover surfaces of the cover 22, the extension portion 22a, and the reinforced element 22b that will become inner surfaces (e.g., facing downward in the orientation of FIG. 5C) when the cover 22 is placed on the wall 21.

Before or after placing the cover 22 on the wall 21, a conductive layer 35' is formed to cover an upper surface 221 of the cover 22. The conductive layers 35, 35' can be formed by, for example, a plating or spray application process.

When the cover 22 is placed on the wall 21, the conductive layers 35, 35' are electrically connected to ones of the leads 20b through the conductive adhesive material AL and the conductive element 36. In one or more embodiments, the conductive layers 35, 35' are electrically connected to grounding leads so as to form a grounding path. The cover 22 coated with one or both of the conductive layers 35, 35' can be used as an EMI shield.

A singulation process is performed to obtain a number of the type of semiconductor device package 3 shown in FIG. 3A. The singulation process is performed by using laser or other appropriate cutting techniques.

Figure 6A:
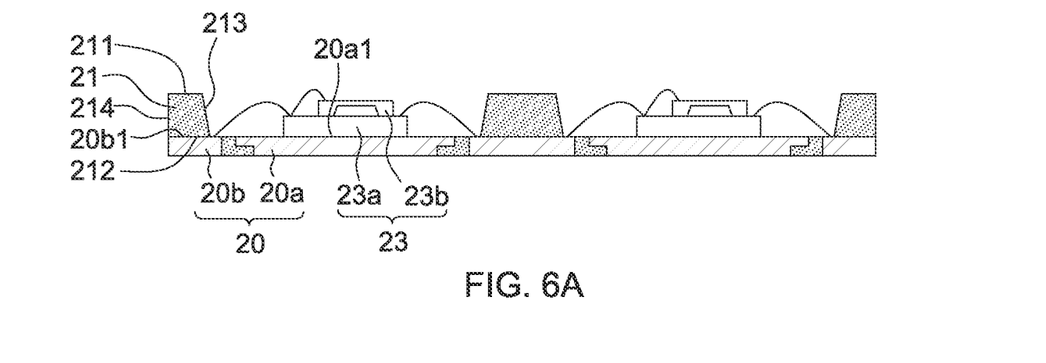
FIG. 6A, FIG. 6B and FIG. 6C illustrate a manufacturing process in accordance with an embodiment of the present disclosure.
Figure 6B:
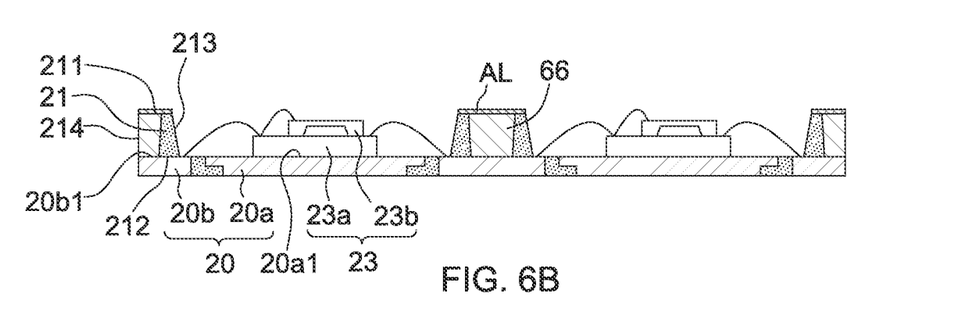
Figure 6C:
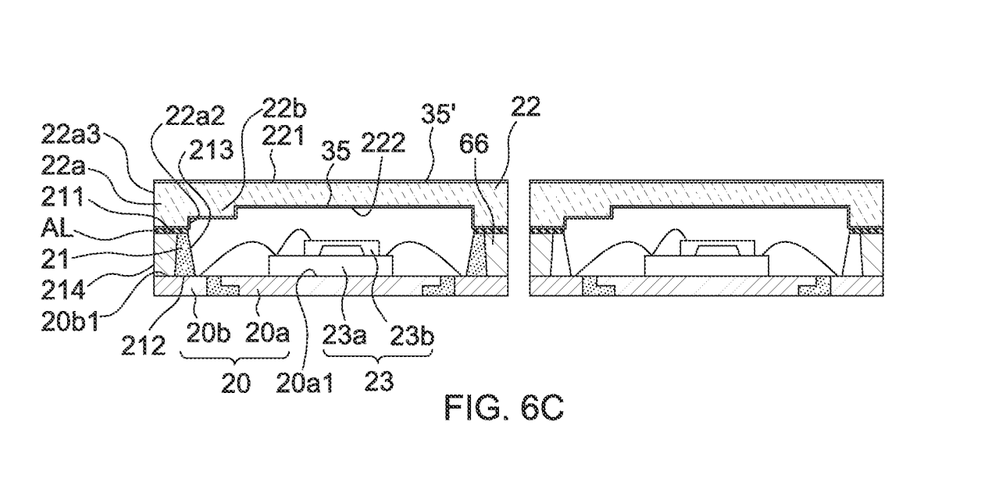

FIG. 6A, FIG. 6B and FIG. 6C together illustrate a semiconductor manufacturing process in accordance with an embodiment of the present disclosure. The semiconductor manufacturing process shown in FIG. 6A, FIG. 6B and FIG. 6C is similar to that shown in FIG. 5A, FIG. 5B and FIG. 5C, except that a conductive element 66 (in FIG. 6B) is different from the conductive element 36 (in FIG. 5B).

As shown in FIG. 5B, two conductive elements 36 are formed, such that the conductive element 36 of a carrier 20 is not exposed from a lateral surface of the wall 21 at the exterior of a singulated package (FIG. 5C). In comparison, as shown in FIG. 6B, one conductive element 66 is formed across two adjacent carriers 20, such that the conductive element 66 is exposed from a lateral surface of the wall 21 at the exterior of a singulated package (FIG. 6C).

Figure 7A:
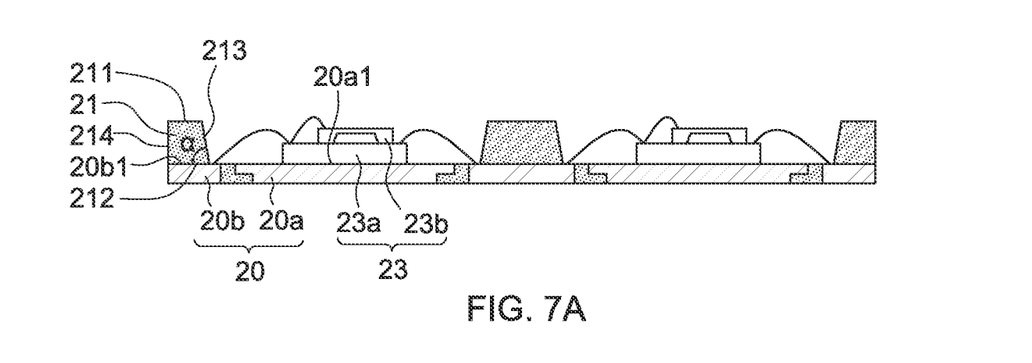
FIG. 7A, FIG. 7B, FIG. 7C and FIG. 7D illustrate a manufacturing process in accordance with an embodiment of the present disclosure.
Figure 7B:
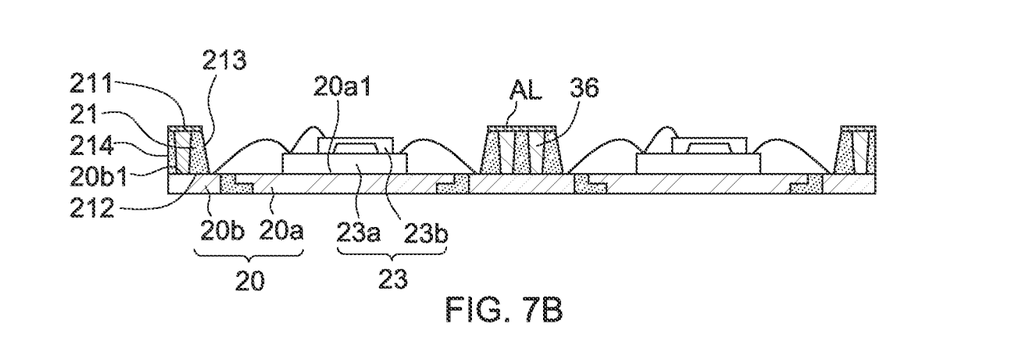
Figure 7C:
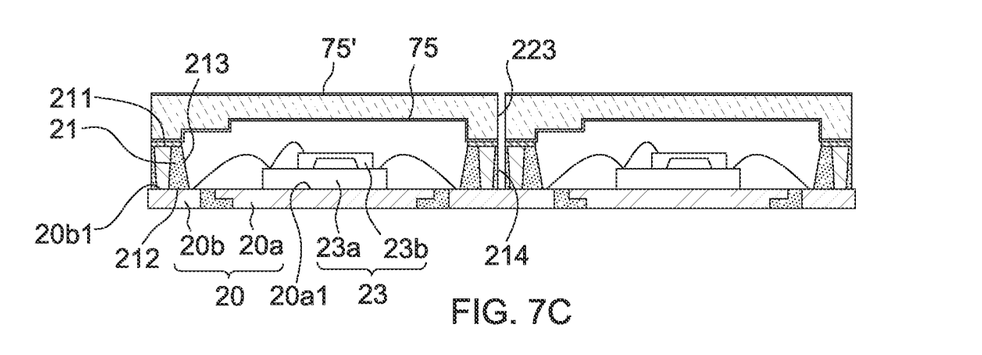

FIG. 7A, FIG. 7B, FIG. 7C and FIG. 7D together illustrate a semiconductor manufacturing process in accordance with an embodiment of the present disclosure. The semiconductor manufacturing process shown in FIG. 7A, FIG. 7B and FIG. 7C is similar to that shown in FIG. 5A, FIG. 5B and FIG. 5C, except that the singulation shown in FIG. 7C is performed using a partial cut technique, while the singulation shown in FIG. 5C is performed using a full cut technique.

Referring to FIG. 7C, a partial cut technique is performed to cut through the cover 22 and down to the carrier 20, without cutting through the carrier 20.

Figure 7D:
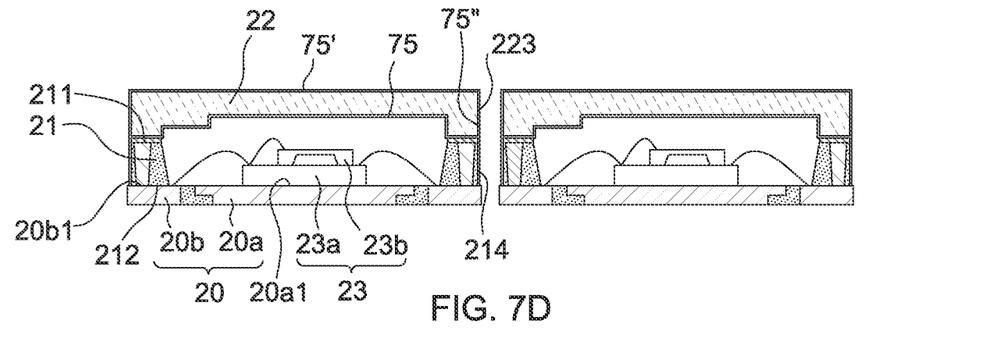

Referring to FIG. 7D, a conductive layer 75" is formed to cover a lateral surface 223 of the cover 22 and the lateral surface 214 of the wall 21. A conductive layer 75 is formed before placing the cover 22 on the wall 21, as described with respect to the conductive layer 35 (FIG. 5C), and a conductive layer 75' is formed before or after placing the cover 22 on the wall 21, as described with respect to the conductive layer 35' (FIG. 5C). In one or more embodiments, the conductive layer 75" is formed in the same process as the conductive layer 75'.

Referring still to FIG. 7D, a cut process is performed to cut through the carrier 20 to separate each semiconductor device package.

By using the partial cut technique shown in FIG. 7C and FIG. 7D, the lateral surface 223 of the cover 22 and the lateral surface 214 of the wall 21 can be covered by the conductive layer 75", so that the cover 22 can be fully covered by the conductive layer 75, 75', 75", so as to increase an EMI shielding capability.

As used herein, the terms "substantially," "substantial," "approximately," and "about" are used to denote small variations. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers (µm) of lying along the same plane, such as within 100 µm, within 80 µm, within 60 µm, within 40 µm, within 30 µm, within 20 µm, within 10 µm, or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1° or ±0.05°. When used in conjunction with an event or ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation. The term "substantially flat" can refer to a surface roughness (Ra) of about 3 µm to about 20 µm, where a difference between a highest point and a lowest point of the surface is about 5 µm to about 10 µm.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a carrier;
    a wall disposed on a top surface of the carrier;
    a cover having a bottom surface including a portion protruding from the bottom surface of the cover, the protruding portion of the cover contacting a top surface of the wall to define a space; and
    a sensor element positioned in the space;
    a bonding wire connecting the sensor element to the top surface of the carrier defining a bottom of the space,
    wherein the wall has an outer lateral surface facing away from the space, the protruding portion of the cover has a first lateral surface facing toward the space and a second lateral surface facing away from the space, and wherein the second lateral surface of the protruding portion of the cover is substantially coplanar with the outer lateral surface of the wall,
    further comprising at least one conductive element exposed from the outer lateral surface of the wall, the conductive element is a grounding ring surrounding the space; and
    a reinforced element contacting the bottom surface of the cover and the protruding portion of the cover, wherein the reinforced element comprises a bottom surface parallel to the bottom surface of the cover and a lateral surface parallel to the first lateral surface of the protruding portion of the cover.

2. The semiconductor device package according to claim 1, wherein the wall has an inner lateral surface facing toward the space, and the inner lateral surface of the wall and a bottom surface of the wall define an angle less than 90 degrees.

3. The semiconductor device package according to claim 2, wherein the angle defined by the inner lateral surface of the wall and the bottom surface of the wall is in a range from approximately 78 degrees to approximately 83 degrees.

4. The semiconductor device package according to claim 1, wherein the first lateral surface of the protruding portion and the bottom surface of the cover define an angle greater than 90 degrees.

5. The semiconductor device package according to claim 4, wherein the angle defined by the first lateral surface of the protruding portion and the bottom surface of the cover is in a range from approximately 93 degrees to approximately 97 degrees.

6. The semiconductor device package according to claim 1, further comprising a conductive layer on the first lateral surface of the protruding portion of the cover and the bottom surface of the cover.

7. The semiconductor device package according to claim 6, wherein the conductive element is electrically connected to the conductive layer.

8. The semiconductor device package according to claim 1, further comprising a conductive layer on a top surface of the cover.

9. A semiconductor device package, comprising:
   a carrier;
   a wall disposed on a top surface of the carrier;
   a cover having a bottom surface and a lateral surface and including a portion protruding from the bottom surface of the cover, the protruding portion of the cover disposed on a top surface of the wall to define a space, the cover comprising a molded material; and
   a sensor element positioned in the space;
   a bonding wire connecting the sensor element to the top surface of the carrier defining a bottom of the space,
   wherein the cover is spaced from the top surface of the carrier, and the wall is disposed between the cover and the top surface of the carrier,
   further comprising at least one electrically conductive element exposed from a lateral surface of the wall, the electrically conductive element is a grounding ring surrounding the space, and
   a reinforced element contacting the bottom surface of the cover and the protruding portion of the cover, wherein the reinforced element comprises a bottom surface parallel to the bottom surface of the cover and a lateral surface parallel to the lateral surface of the cover.

10. The semiconductor device package according to claim 9, wherein the lateral surface of the wall is an outer lateral surface facing away from the space, the protruding portion of the cover has a first lateral surface facing toward the space and a second lateral surface facing away from the space, and the second lateral surface of the protruding portion of the cover is substantially coplanar with the outer lateral surface of the wall.

11. The semiconductor device package according to claim 9, further comprising a conductive layer disposed on the bottom surface of the cover, wherein the carrier comprises at least one pad, the electrically conductive element penetrates the wall, and the conductive layer is electrically connected to the at least one pad through the electrically conductive element.

12. The semiconductor device package according to claim 11, further comprising a conductive adhesive material disposed between the conductive layer and the electrically conductive element, wherein the conductive layer is further electrically connected to the at least one pad through the conductive adhesive material.

13. The semiconductor device package according to claim 11, wherein the conductive layer is a first conductive layer, further comprising a second conductive layer disposed on a top surface of the cover.

14. The semiconductor device package according to claim 11, wherein the cover comprises an aromatic polymer.

15. A semiconductor device package, comprising:
   a carrier;
   a wall disposed on a top surface of the carrier, the wall comprising a molded material;
   a cover having a bottom surface and a lateral surface and including a portion protruding from the bottom surface of the cover, the protruding portion of the cover contacting a top surface of the wall to define a space;
   a sensor element positioned in the space;
   a bonding wire connecting the sensor element to the top surface of the carrier defining a bottom of the space;
   at least one conductive element exposed from a lateral surface of the wall, the conductive element is a grounding ring surrounding the space; and
   a reinforced element contacting the bottom surface of the cover and the protruding portion of the cover, wherein the reinforced element comprises a bottom surface parallel to the bottom surface of the cover and a lateral surface parallel to the lateral surface of the cover.

16. The semiconductor device package according to claim 15, wherein the lateral surface of the wall is an outer lateral surface facing away from the space, the protruding portion of the cover has a first lateral surface facing toward the space and a second lateral surface facing away from the space, and the second lateral surface of the protruding portion of the cover is substantially coplanar with the outer lateral surface of the wall.

\* \* \* \* \*